US006653826B2

(12) United States Patent
Beha

(10) Patent No.: US 6,653,826 B2
(45) Date of Patent: Nov. 25, 2003

(54) ALTERNATING VOLTAGE DETECTOR

(75) Inventor: Christian Beha, Glottertal (DE)

(73) Assignee: Ch. Beha GmbH Technische Neuentwicklungen, Glottertal (DE)

( * ) Notice: Subject to any disclaimer, the term of this patent is extended or adjusted under 35 U.S.C. 154(b) by 0 days.

(21) Appl. No.: 09/852,007

(22) Filed: May 10, 2001

(65) Prior Publication Data

US 2001/0040454 A1 Nov. 15, 2001

(30) Foreign Application Priority Data

May 11, 2000 (DE) .......................... 100 23 048

(51) Int. Cl.[7] .............................. G01R 13/02
(52) U.S. Cl. ..................... 324/76.44; 324/458
(58) Field of Search ............... 324/72.5, 158.1, 324/458, 508, 76.44; 340/657

(56) References Cited

U.S. PATENT DOCUMENTS

| 4,684,887 A | * | 8/1987 | Stewart ................. 324/158.1 |
| 5,285,163 A | * | 2/1994 | Liotta .................... 324/508 |
| 5,293,113 A | * | 3/1994 | Beha et al. ............. 324/72.5 |
| 5,867,019 A | * | 2/1999 | Malenko et al. ........ 324/72.5 |
| 5,877,618 A | | 3/1999 | Luebke et al. .......... 324/72.5 |
| 6,075,448 A | * | 6/2000 | Verkhovskiy ........... 340/657 |
| 6,545,946 B1 | * | 4/2003 | Huss et al. .............. 367/99 |

FOREIGN PATENT DOCUMENTS

| DE | 26 33 638 | 2/1977 |
| DE | 30 29 697 | 3/1982 |
| DE | 42 18 832 | 12/1993 |
| DE | 94 00 903 | 5/1994 |
| WO | 86/04424 | 7/1986 |

* cited by examiner

Primary Examiner—N. Le
Assistant Examiner—Walter Benson
(74) Attorney, Agent, or Firm—Nath & Associates PLLC; Marvin C. Berkowitz

(57) ABSTRACT

An alternating voltage detector having a sensor for the detection of an electric alternating field, an electrical signal transducer connected to the sensor for signaling an electrical alternating field detected by the sensor, and an indicator unit connected to the electrical signal transducer for the indication of the signaled electrical alternating field, has an interference pulse filter arranged between the sensor and the electrical signal transducer which filters out electrical pulses or pulse packets detected by the sensor which have an average pulse duration or average pulse packet duration less than a predetermined time.

16 Claims, 3 Drawing Sheets

ALTERNATING VOLTAGE DETECTOR

The invention relates to alternating voltage detector.

Alternating voltage detectors, which are the starting point of the invention, are known in numerous applications in the state of the art. Such an alternating voltage detector is as a rule provided for detecting voltages in the range of about 50–600 VAC and 50–500 Hz. The alternating voltage detector in general consists of a sensor for detection, preferably without contact, of an electrical alternating field, an electrical signal transducer connected to the sensor for signaling an electrical alternating field detected by the sensor, and an indicator unit connected to the electrical signal transducer for indicating the signaled electrical alternating field. The indication of a detected alternating voltage takes place by the emission of an optical and/or an acoustic signal.

Such an alternating voltage detector is not only provided for voltage detection on plug sockets and the like; conductor breaks on exposed cables or cable drums are also to be traceable with this device. A problem with known commercial alternating voltage detectors is that these also detect electrostatic charges on housings, persons and other surfaces. If the detector detects a discharge (e.g., a spark) based on an electrostatic charge, this is indicated to the user by a short optical or acoustic signal. The impression can thereby arise that given portions are under voltage which are in fact free from voltage.

The invention thus has as its object to configure and develop the known alternating voltage detectors so that such an erroneous indication is no longer possible.

This object is attained according to the invention by an alternating voltage detector with the features of the characterizing portion of the appended independent claim.

Advantageous embodiments and developments of the invention are given in the dependent claims.

The essential concept of the invention consists in that an interference pulse filter is arranged between the sensor and the electrical signal transducer, and filters out electrical pulses or pulse packets detected by the sensor which have an average pulse duration or average pulse packet duration of less than a predetermined time. Thus the invention makes use of the fact that electrostatic charges on housings, persons and other surfaces discharge in a very short time. An erroneous interpretation of electrostatic charges is thereby substantially excluded.

Preferably, the interference pulse filter is designed so that electrical pulses are filtered out which have a pulse duration smaller than half the period of the electrical alternating field to be detected. This is of particular advantage when the discharge of the electrostatic charge takes place very quickly in comparison with an alternating pulse of an alternating voltage to be detected having a frequency between 50 and 500 Hz.

The sensor is preferably embodied as an antenna-like electrode which is insulated with respect to the surroundings. Such an arrangement permits a contactless alternating voltage detection.

In a particularly advantageous embodiment of the invention, a threshold circuit is connected following the sensor. This threshold circuit ensures that an alternating voltage signal is only indicated when a predetermined threshold voltage is exceeded. An indication thus takes place only in a predetermined frequency and voltage range of the alternating signal to be detected.

In a particularly advantageous embodiment of the invention, it is provided that the electrical signal transducer is a monostable flipflop. The reset time constant of the monostable is preferably to be chosen greater than the period of the alternating signal to be detected. This has the consequence that resetting of the monostable does not occur during the detection of such an alternating signal, but resetting of the monostable occurs in the case of the detection of an individual interference pulse. The output signal of the monostable is particularly suitable for driving an optical or acoustic signal transducer. In particular, it is provided that this monostable enables a pulse generator which produces an alternating signal which in its turn is used to produce an optical blinking or flickering signal or an acoustic signal.

In a particularly advantageous embodiment of the invention, it is provided that the series connection of the interference pulse filter and the monostable is realized in that between the input terminal and the output terminal, there is situated a first ohmic resistor which is in parallel with the series combination of a second ohmic resistor and a diode polarized in the forward direction, the resistance value of the first ohmic resistor being greater than that of the second ohmic resistor, and in that the output terminal is connected via a capacitor to a reference potential, the charging time constant given by the resistance value of the second ohmic resistor and the capacity of the capacitance being greater than half the period of the electric alternating field to be detected.

An example of the invention is shown in the accompanying drawing and is described in more detail hereinbelow.

Figure 1:
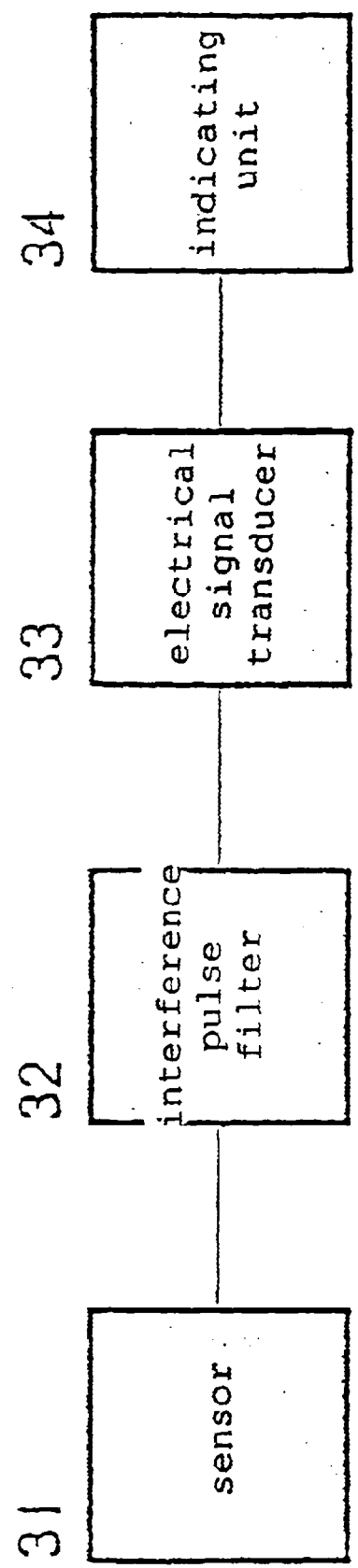
FIG. 1 shows a block circuit diagram of the alternating voltage detector according to the invention.

The components from which an alternating voltage detector according to the invention is constructed can be gathered, for example, from FIG. 1:

The alternating voltage detector has a sensor 31 for the detection of an electrical alternating field. An interference pulse filter 32 is connected to this sensor 31, and filters out from the electrical pulses detected by the sensor 31 those having a pulse duration smaller than half the period of the electrical alternating field to be detected. Connected to this interference pulse filter 32 is an electrical signal transducer 33 for signaling an electrical alternating field detected by the sensor 31. There is furthermore connected to this electrical signal transducer 33 an indicator unit 34 for the indication of the signaled electrical alternating field. This indicator unit 34 has, for example, an optical signal transducer (e.g., an incandescent lamp, glow lamp, light emitting diode, etc.) or an acoustic signal transducer (e.g., a sound emitter, loudspeaker, etc.).

Figure 2:
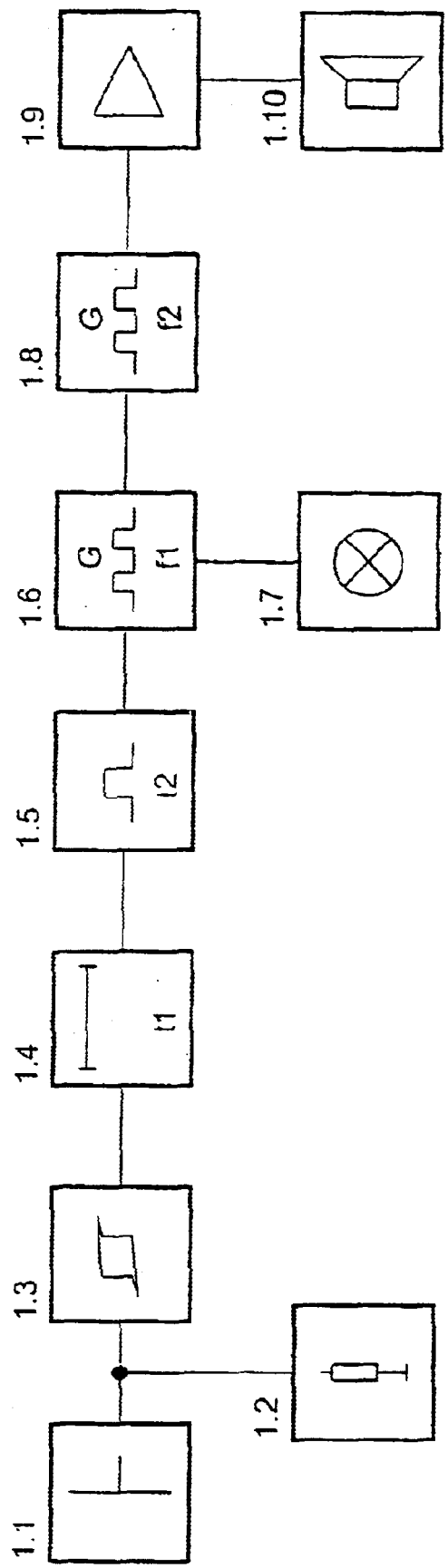
FIG. 2 shows a block circuit diagram of an embodiment example of the circuit according to the invention.

In the embodiment of the invention shown in FIG. 2, a flat electrode 1.1 is situated at the input of the circuit and represents in principle a plate of a capacitor. For a contactless voltage detector, the electrode 1.1 is preferably electrically isolated from the surroundings by the housing. A probe load 1.2 is connected to this isolated flat electrode 1.1, and is connected to the reference potential. If the isolated flat electrode 1.1 encounters a sufficiently strong electrical alternating field, the threshold value circuit 1.3 connected to the isolated flat electrode 1.1 and the probe load 1.2 is triggered at the same frequency as that of the electrical alternating field, and thus produces a digitized output signal. This digitized output signal is supplied to an interference pulse filter 1.4. This interference pulse filter 1.4 monitors whether the signal is a short interference pulse with a pulse duration of, for example, less than 10 ms, or an alternating voltage whose period is, for example, 20 ms.

A monostable 1.5 having for example a reset time constant of 200 ms and connected to the interference pulse filter 1.4 is triggered by the "evaluated" signal.

As long as a corresponding alternating signal is detected, this monostable 1.5 enables a pulse generator 1.6 which is connected to it, and which produces, for example, an electrical alternating signal with a frequency of, for example, 5 Hz. This alternating signal is supplied to an optical signal transducer 1.7, for example, a light emitting diode or a glow lamp, which blinks or flickers in step with the alternating signal.

The alternating or pulse signal present at the output 1.6 furthermore controls a second pulse generator 1.8, which produces pulses at a frequency of, for example, about 2 kHz. This pulse signal is used to drive an acoustic signal transducer 1.10, which in the example is driven by an amplifier stage 1.9 in order to obtain a sufficiently loud signal.

The sensitivity of the circuit is substantially determined by the size of the electrode surface of the isolated flat electrode 1.1, by the ohmic resistance value of the probe load 1.2, and the trigger voltages of the threshold value circuit 1.3. Matching to suitable alternating voltage values and frequency values is thus possible. For example, if the alternating voltage detector is used to detect the (household) main voltage, the sensitivity of the circuit is accordingly matched to the corresponding voltage and frequency values (Europe, USA, etc.).

Figure 3:
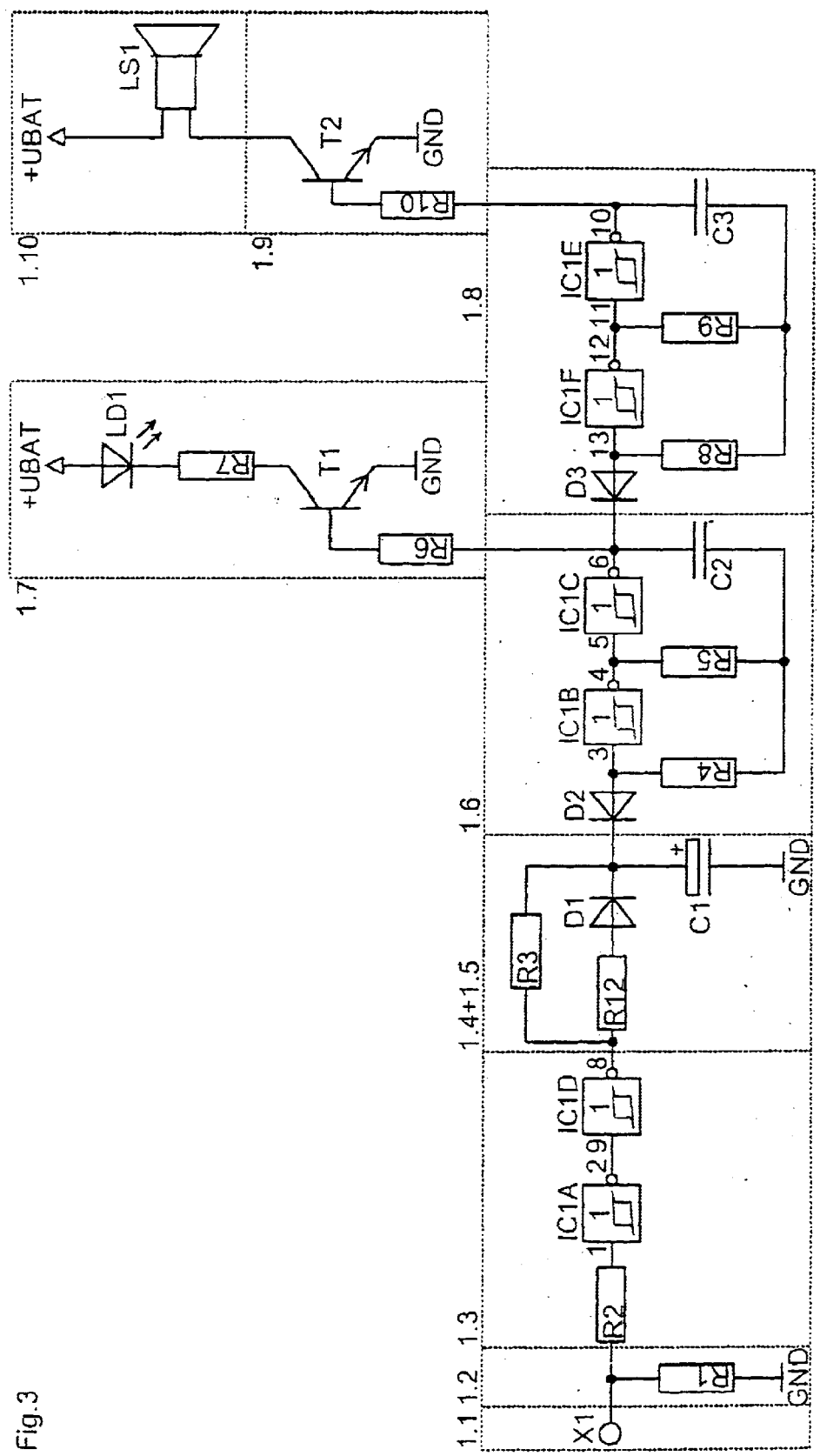
FIG. 3 shows a detailed embodiment example of the circuit arrangement according to the invention.

It will be apparent from FIG. 3 how the circuit shown as a block circuit diagram in FIG. 2 can be realized with discrete components. In FIG. 3, the circuit portions corresponding to the block symbols of FIG. 2 are denoted by dashed block symbols and are given the reference numbers 1.1–1.10 corresponding to FIG. 2. The electrode X1 in FIG. 3 corresponds to the isolated flat electrode 1.1. The probe load 1.2 is realized by an ohmic resistor R1 with a resistance value of 180 MΩ, one end of which is connected to the electrode X1 and the other end to the reference potential GND. The threshold value circuit 1.3 is realized by the series connection of an ohmic resistor R2 and two inverting Schmitt triggers IC1A and IC1D, likewise connected together in series. The commercially available component 74 HC14 was used in the example. For completeness, the corresponding pin connections are shown in the drawing by the reference numbers 1–14. The ohmic resistor R2 has a resistance value of 3.9 MΩ. The operating voltage of the component 74 HC14 is 3 volts in the example, and is applied to pins 7 and 14.

The series circuit of interference pulse filter 1.4 and monostable 1.5 is realized by a first ohmic resistor R3 connected in parallel with a second ohmic resistor R12 and a diode D1 (type 4448) polarized in the forward direction, which are connected in series, the output terminal of this parallel/series circuit being placed at the reference potential GND via a capacitor C1. The ohmic resistor R3 has a resistance value of 470 kΩ, and the ohmic resistor R12 a value of 82 kΩ. The capacity of the (electrolytic) capacitor C1 is 1 µF. This results in a charging time constant of about 82 ms and a discharge time constant of 470 ms.

The operation of such a circuit arrangement takes place as follows:

If an alternating signal to be detected is present at the input, the capacitor C1 is (preferably) charged during a positive half-wave of the signal via the resistor R12 and the series-connected diode D1, and a positive output signal is present at the output of the arrangement. Only a small discharge can take place via the first ohmic resistor R3 during the succeeding negative half-wave, since the discharge time constant of the capacitor C1, resulting from the capacity value of the capacitor C1 and the resistance value of the first ohmic resistor R3, is substantially greater than the charging time constant of the capacitor C1, resulting essentially from the second ohmic resistance R12 and the capacity of the capacitor C1. Consequently, with an alternating signal, a positive electrical signal is nearly exclusively present at the output terminal of the circuit.

The situation is different when only a pulse of short duration, such as is caused by an electrostatic discharge, is present at the input. In this case, only slight charging of the capacitor C1 takes place via the second resistor R12 and the diode D1 polarized in the forward direction. The signal thereby present at the output is accordingly too small to drive the subsequent components. Since the pulse duration is insufficient to adequately charge the capacitor C1, this is discharged again via the first ohmic resistor R3.

The pulse generator 1.6 is realized by means of two inverting Schmitt triggers IC1B and IC1C, which are likewise constituents of the component 74 HC14, these two Schmitt triggers IC1B and IC1C being connected in series. The output of the second Schmitt trigger IC1C forms at the same time the output of the pulse generator 1.6. This output is fed back to the input of the second Schmitt trigger IC1C via a capacitor C2 and an ohmic resistor R5. At the same time, the output is also fed back to the input of the first Schmitt trigger IC1B via the capacitor C2 and the ohmic resistor R4. The whole circuit arrangement is decoupled from the output of the interference pulse filter 1.4/ monostable 1.5 by means of a diode D2 polarized in the blocking direction. The resistance values of the ohmic resistances R4 and R5 are respectively 3.9 MΩ and 3 MΩ. The capacity of the capacitor C2 is 6.8 nF. There thereby results at the output of the pulse generator 1.6 a substantially square-wave alternating signal with a frequency of about 20 Hz.

In the example, this alternating signal, via an ohmic resistor R6 (4.7 kΩ), drives the base of a npn bipolar transistor T1, which in its turn drives a red light emitting diode LD1 via an ohmic resistor R7 of 47 ohms. In the example, the bipolar transistor T1 is the commercial product BC846B.

At the same time, the square-wave output signal of the pulse generator 1.6 drives a second pulse generator 1.8 with nearly identical construction, i.e., the series circuit of two inverting Schmitt triggers IC1F and IC1E, the output of the inverting Schmitt trigger IC1E being fed back to the input of the inverting Schmitt trigger IC1E via the capacitor C3 and the ohmic resistor R9, and the output of the inverting Schmitt trigger IC1E being fed back to the input of the inverting Schmitt trigger IC1E via the capacitor C3 and the ohmic resistor R8. The feedback resistors R8 and R9 correspond to the ohmic resistors R4 and R5 of the pulse generator 1.6 and have the same resistance values. The feedback capacitor C3 corresponding to the capacitor C2 has in the example a capacity which is smaller by a factor of 100 than that of the feedback capacitor C2. The alternating frequency of the output signal of the second pulse generator 1.8 is consequently 2,000 Hz. This signal is used to drive a loudspeaker LS1 (type CB12AP). For this purpose, the output signal of the pulse generator 1.8 is fed via an ohmic resistor R10 of 4.7 kΩ to the base of a bipolar transistor T2 (type: BC846B) which amplifies this signal and supplies it to the loudspeaker LS1.

An indication of an alternating voltage signal detected by the voltage detector is thus indicated to the user, thus in the example, by an unmistakable flickering of the light emitting diode LD1 at a frequency of 20 Hz and a beeping of the loudspeaker (acoustic transducer) LS1 with a frequency of 2 kHz.

List of Reference Numbers 31 sensor
32 interference pulse filter
33 electrical signal transducer
34 indicating unit
1-14 pinout of the component 74 HC14
1.1 isolated flat electrode
1.2 probe load
1.3 threshold value circuit
1.4 interference pulse filter
1.5 monostable
1.6 pulse generator
1.7 optical signal transducer
1.8 pulse generator
1.9 amplifier stage
1.10 acoustic signal transducer
X1 electrode
GND reference potential
UBAT battery voltage
R1 ohmic resistor
R2 ohmic resistor
R3 ohmic resistor
R4 ohmic resistor
R5 ohmic resistor
R6 ohmic resistor
R7 ohmic resistor
R8 ohmic resistor
R9 ohmic resistor
R10 ohmic resistor
R11 ohmic resistor
R12 ohmic resistor
IC1A inverting Schmitt trigger
IC1B inverting Schmitt trigger
IC1C inverting Schmitt trigger
IC1D inverting Schmitt trigger
IC1E inverting Schmitt trigger
IC1F inverting Schmitt trigger
T1 bipolar transistor
T2 bipolar transistor
LD1 light emitting diode
LS1 loudspeaker
C1 capacitor
C2 feedback capacitor
C3 feedback capacitor
D1 diode
D2 diode
D3 diode

What is claimed is:

1. An alternating voltage detector having a sensor (31) that outputs a digitized output signal for the detection of an electric alternating field, an electrical signal transducer (33) connected to the sensor (31) for signaling an electrical alternating field detected by the sensor (31), and an indicator unit (34) connected to the electrical signal transducer (33) for the indication of the signaled electrical alternating field, further comprises:
an interference pulse filter (32, 1.4) arranged between the sensor (31) and the electrical signal transducer (33), said interference pulse filter adapted to determine if electrical pulses detected by the sensor (31) have an average pulse duration less than a predetermined time, and
wherein said interference pulse filter filters the pulses having the average pulse duration less than the predetermined time out of the digitized output signal.

2. Alternating voltage detector according to claim 1, wherein the interference pulse filter (32, 1.4) filters out electrical pulses detected by the sensor (31) and having a pulse duration less than half of the period of the alternating electrical field to be detected.

3. Alternating voltage detector according to claim 1, wherein the sensor (31) has an isolated flat electrode (1.1).

4. Alternating voltage detector according to claim 1, wherein a threshold value circuit (1.3) is connected after the sensor (31, 1.1).

5. Alternating voltage detector according to claim 1, wherein the indicator unit (34) has an optical signal transducer (1.7).

6. Alternating voltage detector according to claim 1, wherein the indicator unit (34) has an acoustic signal transducer (1.10).

7. Alternating voltage detector according to claim 1, wherein the electrical signal transducer (33) is a monostable flipflop (1.5).

8. The alternating voltage detector according to claim 7, comprises a series circuit having an input terminal and an output terminal, of the interference pulse filter (1.4) and the monostable flipflop (1.5), the series circuit comprising:
a parallel circuit of a first ohmic resistor (R3) connected in parallel with a series combination of a second ohmic resistor (R12) and a diode (D1) polarized in a forward direction, the parallel circuit being connected between the input terminal and the output terminal, and wherein the resistance value of the first ohmic resistor (R3) is greater than that of the second ohmic resistor (R12),
a capacitor (C1) is connected between the output terminal and a reference potential GND, and
the charging time constant of the capacitor (C1) given by the resistance value of the second ohmic resistor (R12) and the capacity of the capacitor (C1) is greater than half the period of the electrical alternating field to be detected.

9. An alternating voltage detector having a sensor (31) that outputs a digitized output signal for the detection of an electric alternating field, an electrical signal transducer (33) connected to the sensor (31) for signaling an electrical alternating field detected by the sensor (31), and an indicator unit (34) connected to the electrical signal transducer (33) for the indication of the signaled electrical alternating field, further comprises:
an interference pulse filter (32, 1.4) arranged between the sensor (31) and the electrical signal transducer (33), said interference pulse filter adapted to determine if electrical pulse packets detected by the sensor (31) have an average pulse packet duration less than a predetermined time, and
wherein said interference pulse filter filters the pulse packets having the average pulse packet duration less than the predetermined time out of the digitized output signal.

10. Alternating voltage detector according to claim 9, wherein the interference pulse filter (32, 1.4) filters out electrical pulse packets detected by the sensor (31) and having a pulse packet duration less than half of the period of the alternating electrical field to be detected.

11. Alternating voltage detector according to claim 9, wherein the sensor (31) has an isolated flat electrode (1.1).

12. Alternating voltage detector according to claim 9, wherein a threshold value circuit (1.3) is connected after the sensor (31, 1.1).

13. Alternating voltage detector according to claim 9, wherein the indicator unit (34) has an optical signal transducer (1.7).

14. Alternating voltage detector according to claim 9, wherein the indicator unit (34) has an acoustic signal transducer (1.10).

15. Alternating voltage detector according to claim 9, wherein the electrical signal transducer (33) is a monostable flipflop (1.5).

16. The alternating voltage detector according to claim 15, comprises a series circuit having an input terminal and an output terminal, of the interference pulse filter (1.4) and the monostable flipflop (1.5), the series circuit comprising:

a parallel circuit of a first ohmic resistor (R3) connected in parallel with a series combination of a second ohmic resistor (R12) and a diode (D1) polarized in a forward direction, the parallel circuit being connected between the input terminal and the output terminal, and wherein the resistance value of the first ohmic resistor (R3) is greater than that of the second ohmic resistor (R12), a capacitor (C1) is connected between the output terminal and a reference potential GND, and the charging time constant of the capacitor (C1) given by the resistance value of the second ohmic resistor (R12) and the capacity of the capacitor (C1) is greater than half the period of the electrical alternating field to be detected.

* * * * *